United States Patent

Eshima et al.

[11] Patent Number: 6,121,178
[45] Date of Patent: Sep. 19, 2000

[54] SINTERED ITO AND AN ITO SPUTTERING TARGET

[75] Inventors: Kohichiro Eshima; Kouki Toishi; Katsuaki Okabe; Tsuyoshi Nishimura, all of Honjo; Shinji Sato, Omonogawa-machi; Choju Nagata, Honjo, all of Japan

[73] Assignee: Dowa Mining Co., Ltd., Tokyo, Japan

[21] Appl. No.: 08/944,095

[22] Filed: Oct. 2, 1997

[30] Foreign Application Priority Data

Oct. 4, 1996 [JP] Japan .................................. 8-282963
Sep. 26, 1997 [JP] Japan .................................. 9-279550

[51] Int. Cl.[7] .......................... C04B 35/453; C23C 14/08; C23C 14/34
[52] U.S. Cl. .................... 501/126; 501/134; 204/192.26; 204/192.29; 204/298.13
[58] Field of Search .................... 501/126, 134; 204/192.26, 192.29, 298.13

[56] References Cited

U.S. PATENT DOCUMENTS

| | | | |
|---|---|---|---|
| 4,647,548 | 3/1987 | Klein | 501/134 |
| 4,962,071 | 10/1990 | Bayard | 501/134 |
| 5,071,800 | 12/1991 | Owamoto et al. | |
| 5,094,787 | 3/1992 | Nakajima et al. | |
| 5,401,701 | 3/1995 | Ogawa et al. | 501/134 |
| 5,433,901 | 7/1995 | Rancoule et al. | 501/134 |
| 5,480,531 | 1/1996 | Weigert et al. | 501/134 |
| 5,480,532 | 1/1996 | Schlott et al. | |
| 5,531,948 | 7/1996 | Schlott et al. | 501/134 |
| 5,700,419 | 12/1997 | Matsunaga et al. | 501/134 |
| 5,762,768 | 6/1998 | Goy et al. | 501/134 |
| 5,866,493 | 2/1999 | Lee et al. | 501/134 |

FOREIGN PATENT DOCUMENTS

| | | |
|---|---|---|
| 403044464 | 2/1991 | Japan . |
| 403044465 | 2/1991 | Japan . |
| 5-30905 | 5/1993 | Japan . |
| 5-209264 | 8/1993 | Japan . |
| 6-48816 | 2/1994 | Japan . |
| 6-68935 | 8/1994 | Japan . |
| 7-29770 | 4/1995 | Japan . |
| 7-65167 | 7/1995 | Japan . |
| 8-41634 | 2/1996 | Japan . |

OTHER PUBLICATIONS

Bates et al, "Electrical Conductivity, Seebeck Coefficient, and Structure of $In_2O_3$–$SnO_2$", Am. Ceram. Soc. Bull. 65(4), pp. 673–678, (1986) (No Month).

*Primary Examiner*—Mark L. Bell
*Assistant Examiner*—David Sample
*Attorney, Agent, or Firm*—Frishauf, Holtz, Goodman, Langer & Chick, P.C.

[57] ABSTRACT

Sintered ITO having a relative density of at least 88% and an oxygen content of 15.5–17.0 wt %, as well as an ITO sputtering target made of this sintered ITO. Using the target, an optimal range for the proportion of oxygen in a mixture of argon and oxygen gases used as a sputtering atmosphere is sufficiently expanded to permit the consistent formation of ITO films.

12 Claims, 1 Drawing Sheet

SINTERED ITO AND AN ITO SPUTTERING TARGET

BACKGROUND OF THE INVENTION

1. Field of the Invention

This invention relates to sintered ITO (indium-tin oxide) for use as a target in the formation of an ITO film by sputtering. The invention also relates to a target made of such sintered ITO.

2. Background Information

An ITO film is one of the most common light-transmissive and electrically conductive films and it finds extensive use as transparent electrodes in liquid-crystal displays, solar cells and other optoelectronic devices. While ITO films can be fabricated by various methods including spraying, vacuum evaporation, ion plating and sputtering, the last-mentioned method has drawn particular attention since it is capable of producing ITO films of good quality at high yield.

In proportion as displaying devices tend to have more and more increased areas and become more and more sophisticated, the needs for ITO films having decreased resistance and increased light transmittance is becoming greater. Thus, with respect to the sputtering in which a sintered ITO is used as a target, study has been made to solve problems such as how to secure the stability of film formation during sputtering, how to restrain the formation of particles, how to avoid the blackening of the target surface and how to suppress the formation of nodules in order to obtain films satisfying the above stated requirements.

It is known that by decreasing the porosity of sinters, i.e. by increasing the density thereof, the occurrence of blackening and the formation of nodules during the sputtering can be suppressed effectively to ensure the stable formation of sputterred films.

In order to produce an ITO film of low specific resistance using a sintered ITO target, it is desired that the dissolution of carrier Sn and the oxygen holes which also work as carriers should be kept within appropriate ranges that allow a homogeneous ITO film to be formed in a consistent manner. To this end, sputtering is usually performed with a mixture of argon and oxygen gases being used such as to control the conditions for forming a desired ITO film. In this case, the proportion of oxygen in the mixed gas affects the specific resistance of the resulting ITO film as shown in FIG. 1. If the proportion of oxygen is unduly low, the film forming atmosphere is slightly in a reducing state and substances of high electric resistance such as InO will form to increase the specific resistance of the ITO film being produced. In addition, metallization and the formation of whiskers occur in an oxygen-lean region to reduce the light transmittance of the film. On the other hand, if the proportion of oxygen is unduly high, oxygen holes working as carriers will decrease to eventually increase the specific resistance of the film. Therefore, maintaining the proportion of oxygen within an optimal range such that the specific resistance of the ITO film being formed is held consistently low is critical to successful sputtering. A problem to be considered here is that if an optimal range for the proportion of oxygen is narrow, it is difficult to form an ITO film of low specific resistance in a consistent manner.

Indium-tin oxide (ITO) sputtering targets are used in the formation of transparent, electrically conductive films. Such targets are customarily produced by sintering a compact of a tin oxide containing indium oxide powder which is either a mixture of indium oxide and tin oxide powders or derived from a coprecipitated powder. Examples of the starting materials for ITO production include an indium oxide powder, a tin oxide powder, a mixture of indium oxide and tin oxide powders, and a tin oxide containing indium oxide powder derived from a coprecipitated powder. To prepare an indium oxide powder, an aqueous solution of an indium salt as a starting material for synthesis is reacted with an aqueous solution of ammonia or an alkali hydroxide such as sodium hydroxide to make indium hydroxide, which is washed with water, dried and sintered. If a tin salt is incorporated in the aqueous indium salt solution, a tin-containing coprecipitated powder will result and from this powder, a tin oxide containing indium oxide powder can also be obtained.

The tin content of ITO is variable with the conditions of film formation and the desired film characteristics; typically, it ranges from 2 to 20 wt %, particularly from 4 to 15 wt %, in terms of $SnO_2$.

Sintered ITO for use as a sputtering target has commonly been produced by a cold press sintering process which comprises the steps of pressing a starting powder into a compact at ordinary temperature, sintering the compact and machining it to a final form.

Commonly, however, indium oxide powder or tin oxide powder is poor in sinterability. They can not be sintered into high density sinter products when sintered in an ordinary open air atmosphere. As disclosed in Unexamined Published Japanese Patent Application No. Hei 5-209264, there is a proposed sintering method in which an oxygen partial pressure is controlled. This process could not produce a sinter of sufficiently high density, when performed under low oxygen partial pressure.

Other proposals for the production of high-density sinters include hot pressing, HIP (hot isostatic pressing) and other methods in which pressure is applied under hot conditions to allow for an increase in the density of the sinter being formed.

Still other proposals for the production of high-density sinters include a method as disclosed in the Examined Published Japanese Patent Application No. Hei 5-30905 in which sintering is performed in the pressurized oxygen atmosphere in order to suppress the dissociation of $In_2O_3$ to thereby increase the density of sinters.

Hot pressing, HIP and the sintering in pressurized oxygen require more investment than normal sintering and hence involves increased manufacturing costs, thereby imposing constraints on the effort to produce larger targets. The present inventors have proposed a method as disclosed in the Unexamined Published Japanese Patent Application No. Hei 6-48816 in which high-density sinters are obtained by adjusting the powder characteristics of the starting materials instead of using particularly pressurized oxygen atmosphere. In this process, however, it is not easy to obtain the products having such optimal oxygen content as will be described hereinafter. A process in which low-density sinters are heat treated in an oxygen-free atmosphere such as in vacuo to thereby control the oxygen content of sinters has also been proposed.

SUMMARY OF THE INVENTION

An object, therefore, of the invention is to provide sintered ITO for use as a sputtering target that expands an optimal range for the proportion of oxygen in a mixture of argon and oxygen gases by a sufficient extent to ensure consistent formation of ITO films of low specific resistance.

Another object of the invention is to provide a sputtering target made of said ITO sinter.

Further object of the invention is to provide a method for the production of said ITO sinter.

A still further object of the invention is to provide a method of forming ITO films by sputtering in a consistent manner by using said ITO sinter as a sputtering target.

In order to overcome the difficulties described hereinbefore, the present inventors have made keen studies and as a result, they have found that if a high-density sinter whose oxygen content is within a specified optimal range is used as a sputtering target, consistent formation of ITO films of low specific resistance can be secured. The present invention has been accomplish based on these findings.

The first object of the invention can be attained by sintered ITO having a relative density of at least 88% and an oxygen content of 15.5–17.0 wt %.

The sintered ITO may contain tin in an amount of 4–15 wt % as tin oxide.

These ITO sinters may have a specific resistance of no more than $4 \times 10^{-4}$ Ω·cm.

These ITO sinters can be prepared by a process comprising selecting a mixed $SnO_2$ and $In_2O_3$ powder containing 4–15 wt % $SnO_2$ and having a specific surface area as measured by the BET method of 20 m$^2$/g or more as a starting material, wet dispersing the mixed powder into a slurry containing solid particles whose average particle size is no larger than 1.0 μm, subjecting a slurry to the granulating treatment to obtain granulated particles, pressing the granulated particles into a compact having a relative density of 45% or more and sintering the compact at a temperature in the range of 1400–1600° C. in an atmosphere containing from 20% to less than 100% of oxygen.

The second object of the invention can be attained by an ITO sputtering target composed of an ITO sinter having a relative density of at least 88% and an oxygen content of 15.5–17.0 wt %.

The ITO sinter of which the sputtering target is composed may contain tin in an amount of 4–15 wt % as tin oxide.

These ITO sinters may have a specific resistance of no more than $4 \times 10^{-4}$ Ω·cm.

The ITO sputtering target may be composed of one of the ITO sinters described above which can be prepared by a comprising selecting a mixed $SnO_2$ and $In_2O_3$ powder containing 4–15 wt % $SnO_2$ and having a specific surface area, determined by the BET method, of 20 m$^2$/g or more as a starting material, wet dispersing the mixed powder into a slurry containing solid particles whose average particle size is no larger than 1.0 μm, subjecting the slurry to the granulating treatment to obtain granulated particles, pressing the granulated particles into a compact having a relative density of 45% or more and sintering the compact at a temperature in the range of 1400–1600° C. in an atmosphere containing from 20% to less than 100% of oxygen.

The third object of the invention can be attained by a process for the production of sintered ITO which comprises selecting a mixed $SnO_2$ and $In_2O_3$ powder containing 4–15 wt % $SnO_2$ and having a specific surface area determined by the BET method of 20 m$^2$/g or more as a starting material, wet dispersing the mixed powder into a slurry containing solid particles whose average particle size is no larger than 1.0 μm, subjecting the slurry to the granulating treatment to obtain granulated particles, pressing the granulated particles into a compact having a relative density of 45% or more and sintering the compact at a temperature in the range of 1400–1600° C. in an atmosphere containing from 20% to less than 100% of oxygen.

The fourth object of the invention can be attained by performing the sputtering, using a sputtering target consisting of a backing plate having fixed thereon the ITO sinter described hereinbefore and performing the sputtering in a mixed oxygen and argon gas atmosphere containing 0.6–3.0 vol. % oxygen.

DETAILED DESCRIPTION OF THE INVENTION

Figure 1:
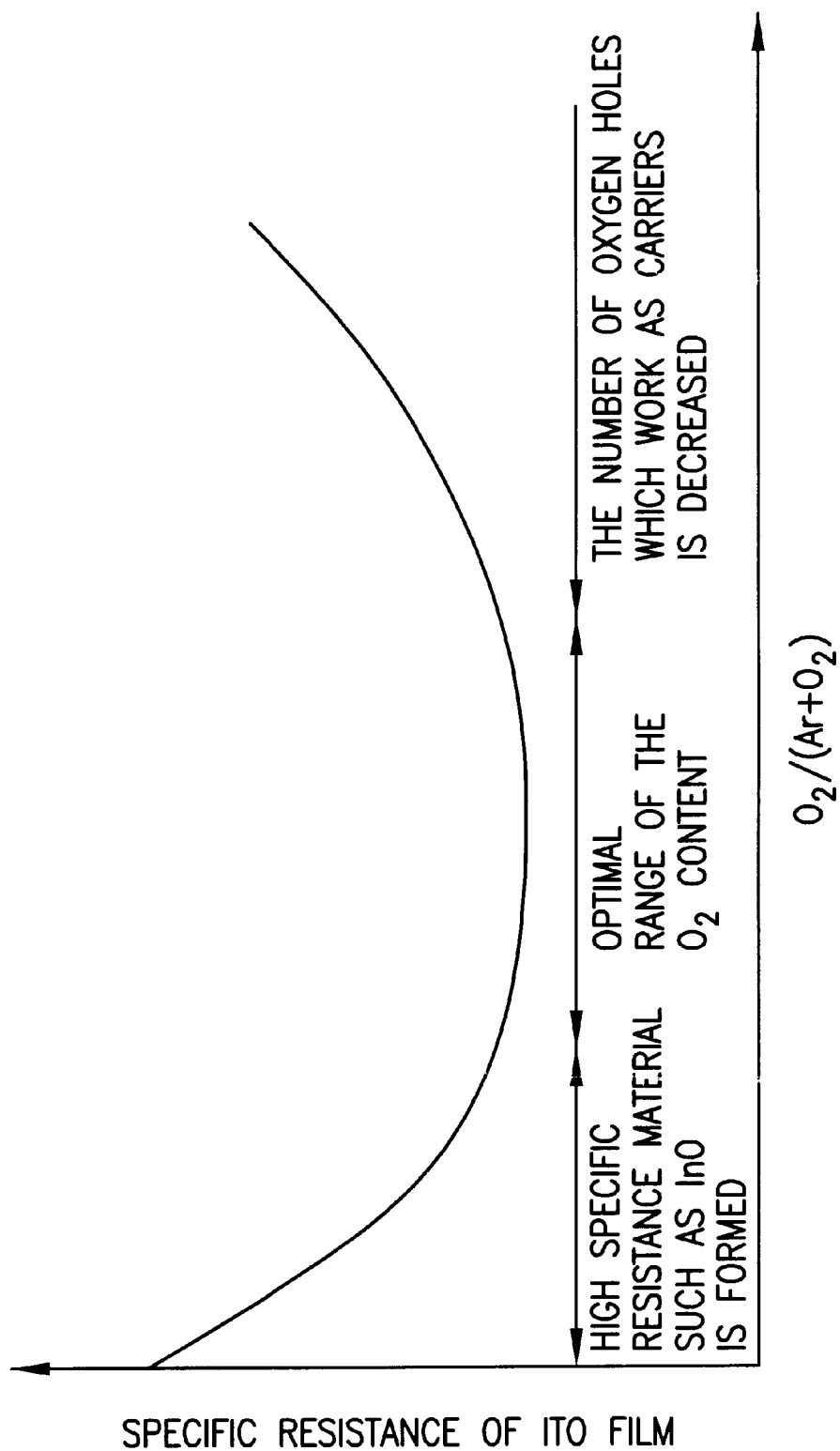
FIG. 1 is a graph showing conceptually the specific resistance of an ITO film as a function of the proportion of oxygen in a mixture of argon and oxygen gases used as a sputtering atmosphere.

The present inventors have found that ITO sinters having the desired high density can be obtained by the process according to the present invention which comprises using as a starting material a mixed powder of $In_2O_3$ and $SnO_2$ whose specific surface area has been adjusted to become no smaller than 20 m$^2$/g for the purpose of increasing the density of the resulting sinter, wet dispersing the mixed powder into a slurry containing solid particles whose average particle size is no larger than 1.0 μm, subjecting the slurry to the granulating treatment to obtain granulated particles, pressing the granulated particles into a compact having a relative density of no less than 45%, preferably no less than 50%, followed by sintering the compact in a sintering atmosphere containing from 20 vol. % to less than 100 vol. % of oxygen. The sintering is performed by holding the compact at temperatures in the range of 1400–1600° C. for 5–20 hours. Components of the sintering atmosphere other than oxygen may be the same as those contained in the air or inert gases.

The sinters thus obtained have been improved in their densities as compared with those of the prior art in spite of the former being sintered at much lower temperatures than the latter, and the resulting sinters are of the state slightly oxygen-dificient as compared with the starting material.

When sputtering was performed to form ITO films by using the ITO sinters of the present invention, the occurrence of blackening and the formation of nodules could properly be restrained and good films were formed in a consistent manner with the optimal range of the proportion of oxygen in the mixed gases being substantially expanded to a satisfactory extent. The process for the production of the ITO sputtering target according to the invention will be explained in more detail hereinbelow.

A typical starting material for the production of ITO sinters is a mixture of $In_2O_3$ and $SnO_2$ powders in specified proportions. Another candidate is a composite powder of $In_2O_3$ and $SnO_2$ prepared by coprecipitation or other suitable methods. In order to increase its sinterability, the powder has desirably a specific surface area of at least 20 m$^2$/g as measured by the BET method.

The $SnO_2$ content is preferably in the range of 4–15 wt %. Below 4 wt %, the number of Sn carriers which contribute to conductivity is insufficient to ensure that an ITO film of low resistance can be produced by sputtering. Beyond 15 wt %, Sn is excessive and does not work as carriers in the ITO film but work as an impurity to reduce its conductivity. Another problem of the increased $SnO_2$ is that it interferes with the sintering of ITO to produce a sinter having only low density. Incidentally, if the $SnO_2$ content is no less than 6 wt %, excessive Sn which could not dissolve in the sinter will precipitate in the form of a Sn-rich compound. Increase in the amount of such precipitated compound will result in the enhancement of bulk resistance of the sinter being produced, which is undesirable because discharge voltage will increase. This is one of the reasons why the $SnO_2$ content should be up to 15%. Customarily, the mixed powders whose $SnO_2$ content is 5–10 wt % are used, though the optimum $SnO_2$ content should be determined based on the substrate temperature during the sputtering, the workability of ITO films and the like factors. The mixed powders are then wet dispersed by using a beed mill, a ball mill or the like, followed by granulating treatment, such as spray drying to obtain granulated particles.

It is desired that in the above steps the mixed $In_2O_3$ and $SnO_2$ powders in the slurry are sufficiently disintegrated and dispersed in such a manner that the laser dispersion diameter (average particle size $d_{50}$) measured in the state of slurry is not larger than 1.0 μm. This is because if the size of coagulated particles of the starting material is unduly large, abnormal particle growth will occur during sintering particularly at the coagulated portions of the particles and the pores remain to produce sinters of only low density. As will be described hereinbelow, oxygen is supplied through such pores during the steps of sintering and cooling and, as a result, depending on the locations, the oxygen content of ITC sinters could become out of the desired range. Thus, sinters of uniform quality cannot be obtained. To obtain sinters of sufficient density taking full advantage of improved sinterability of the starting material powder, coagulated starting material powder must be properly disintegrated. Complete disintegration of the coagulated particles into the monodisperse system is unrealistic because it requires too much energy, and also from the standpoint of handling, it is difficult to make a slurry from such monodisperse system.

Granulation or size enlargement can be effected in the presence of a binding agent such as PVA used as a shaping aid or a lubricant such as stearic acid. Granulated particles (or a size enlarged powder) should preferably have a good lubricity so that uniform filling and pressing may be ensured during the step of pressing. Examples of characteristics to be desirably possessed by granulated particles include an angle of repose within the range of 25° or less and an average granule size as measured by the SEM photograph within the range of 30–80 μm. Particularly when a large size of sinter is to be produced, the above stated requirements have to be fulfilled. As regards the method of granulation, another technique such as "rolling method" can also be employed. The granulated particles thus obtained are placed in a metal mold to be shaped by pressing, followed by further pressing the shaped parts or compacts under applied pressure in the range of 1–3 t/cm² by means of cold isostatic pressing (CIP), to thereby increase the relative density of the compacts to no less than 45%, preferably no less than 50%. If the density of the compacts is unduly low, sufficient sintering reaction cannot occur between granulated particles even if starting material of high sinterability is used. Pores remain between the granulated particles and no sinters of high density can be obtained.

As regards the methods of pressing, the pressure casting is one of the conceivable methods. The resulting shaped parts or compacts are placed in an electric furnace to be sintered.

Typically, the $SnO_2$ content ranges from 5 to 10 wt %; however, an optimal value should be selected from the range of 4–15 wt % in consideration of the substrate temperature during film formation and the machinability of the ITO film.

The sintering atmosphere should contain oxygen in an amount either comparable to or greater than what occurs in air atmosphere. The other component of the sintering atmosphere is an inert gas such as $N_2$ or Ar. The oxygen content should preferably be high in order to give high density, but there is no need to employ the pressurized oxygen atmosphere. Sinters of the desired oxygen content cannot be obtained by sintering in a reducing atmosphere or under vacuum. This is because the oxygen deficient state is easy to occur since the atmosphere becomes a reducing state.

Sintering is performed by holding the compact for a specified period at a temperature in the range of 1400–1600° C., which is high enough to produce a sinter having a relative density of at least 88%. At sintering temperatures higher than about 1200° C., thermodynamic stability is attained in the state in which oxygen is dissociated from ITO. Starting at about 1400° C., Sn dissolves in the sinter and grain growth progresses to increase its density. If the sinter has only low density (due, for example, to low density of the compact or small sinterability of the powder), the pores in the sinter have such a large surface area that it adsorbs oxygen to become oxidized again in subsequent cooling. On the other hand, if the sinter has a sufficient relative density ($\geqq 88\%$), it will not be supplied with oxygen during cooling but instead it is cooled keeping a state in which oxygen is slightly dissociated to thereby yield a slightly oxygen-deficient sinter, which has a blue black color.

If sintering is performed below 1400° C., sinters of sufficient density cannot be obtained. Above 1600° C., the amount of disociated oxygen increases and no sinters of the desired oxygen content will be obtained.

The outside surface of the sinters produced by the process described hereinabove was ground and polished to sputtering targets, which were set up in a sputtering machine and evaluated for their performance during film formation by sputtering. Blackening and subsequent formation of nodules which would affect the sputter rate and the quality of the film being formed occurred to only a limited extent and the target life was such that the desired film could be formed on a fairly consistent manner from the initial to the end phase. In addition, the ITO films formed were satisfactory in characteristics such as specific resistance and light transmittance.

The reason why there is the desired range of the oxygen content of sinters is considered to be as follows.

In the sputtering of ITO sinters, the partial pressure of $O_2$ in the sputtering atmosphere is low. Therefore, when ITO sinters are sputtered in the form of clusters, the oxygen-deficient state is prone to occur. For this reason $O_2$ as well as Ar are introduced into the sputtering atmosphere as sputtering gas components. However, the oxygen content of sinters cannot be fully controlled by the thus introduced gases, but the film characteristics are much affected by the state of sinters. In the typical sputtering conditions as shown in the working examples, it is considered to be desirable that the targets are of slightly oxygen-deficient condition.

The theoretical oxygen content of $In_2O_3$ is 17.29% and that of $SnO_2$ is 21.24%. The theoretical oxygen content of ITO varies with the state of the dissolved $SnO_2$, the presence of intermediate products and the content of $SnO_2$ but one may safely conclude that ordinary ITO has a theoretical oxygen content of about 17.3% and more. In contrast, the ITO sinter of the invention is slightly deficient of oxygen. However, if the oxygen content of the sinter is lower than 15.5%, metallization will occur during film formation or lower oxides of high resistance such as InO will form to increase the specific resistance of the ITO film being formed or its light transmittance tends to decrease. On the other hand, if the oxygen content of the sinter exceeds 17.0%, the number of oxygen holes which work as carriers during film formation will decrease to thereby increase the specific resistance of the ITO film being formed. Therefore, the oxygen content of the ITO sinter lies desirably within the range of 15.5–17.0%. If the sintered ITO meeting this requirement is used as a target in sputtering, an optimal range for the proportion of oxygen in the mixture of argon and oxygen gases can be sufficiently expanded to ensure the production of ITO films of low resistance.

While the adjustment of the oxygen content is the primary reason for ensuring that the sinter will have a relative density of at least 88%, sputtering stability is another reason for this density requirement. (The theoretical density of ITO was calcurated assuming that the theoretical density of $In_2O_3$ is 7.18 $g/cm^3$ and that of $SnO_2$ is 6.93 $g/cm^3$ and that ITO consists of the mixture of $In_2O_3$ and $SnO_2$.) The theoretical density of ITO (whose $SnO_2$ content is 10%) is equal to 7.155 $g/cm^3$. As is well known, ITO sputtering occasionally experiences a phenomenon called "blackening", in which lower oxides of a black color form on the surface of the target and interfere with the sputtering process to reduce the sputter rate; upon further growth, the black oxides become protuberances called "nodules", which will cause abnormal electrical discharge and the particles flipped thereby will turn into foreign matter in the ITO film.

The principal reason for the occurrence of "blackening" is the presence of voids in the sinter and increasing its density is equivalent to reducing the number of such voids and hence contributes to increased resistance to blackening, thereby assuring stability in the film formation. The resistance to blackening is particularly improved if the relative density of the sinter is at least 88%.

The specific resistance (bulk) of the sinter may be measured by a four-terminal method and it should preferably be as low as possible in order to ensure that the sputtering voltage is sufficiently reduced to prevent the film from undergoing excessive plasma damage.

According to the finding of the present inventors, the specific bulk resistance of the sinter should preferably be no more than $4\times10^{-4}$ $\Omega\cdot cm$, more preferably $2\times10^{-4}$ $\Omega\cdot cm$ and less, in order to produce ITO films of low resistance.

EXAMPLE 1

The ITO powder available from DOWA CHEMICAL CO. LTD. (trade name ZY-ITO POWDER, a mixed powder of $In_2O_3$ and $SnO_2$ having the $SnO_2$ content of 10 wt %, the BET of 32.0 $m^2/g$ and an average particle size as measured by the laser dispersion method of 3.4 $\mu m$) was used as a starting material. The starting material was placed in a wet-type beed mill in which a slurry having the solid content of 40% was treated for dispersion for 1 hour, to obtain a slurry having particles whose $d_{50}$ is equal to 0.7 $\mu m$. The slurry was granulated, for example, by using a spray drier into granulated particles having an average particle size as determined by the SEM photograph method of 40 $\mu m$. The granulated powder was placed in a metal mold and it was pressed with an applied pressure of 500 $kg/cm^2$, followed by compaction by means of the CIP with an applied pressure of 2 $t/cm^2$ to obtain compacts of $\phi 150\times 10^{mm}$. The relative density of the compacts thus obtained was 52%. The compacts thus prepared were placed in an electric furnace and heated at 1500° C. for 5 hours. The sintering atmosphere was air. The resulting ITO sinter was machined into the target having dimensions of $\phi 4"\times 6$ $mm^t$. The sintered ITO was fixed to a backing plate by brazing to thereby obtain a sputtering target.

The scrap from the machining operation was cleaned and measured for the density of the sinter and its oxygen content. The density of the sinter was measured by the Archimedean method. For measurement of the oxygen content, each sinter sample was put into a mortar, ground into particles no larger than 1 mm and set on an oxygen-nitrogen measuring apparatus of LECO. The specific bulk resistance of each sinter was measured by the four-terminal method. Using the targets, ITO films were formed by sputtering under the conditions set forth below.

| | |
|---|---|
| Apparatus | DC magnetron sputtering apparatus |
| Target | ITO (4 $in^\phi$ × 6 $mm^t$) |
| Ultimate pressure | $5 \times 10^{-7}$ Torr |
| Sputtering pressure | 1.3–1.5 mTorr |
| Discharge current | 0.2 A |
| Power supplied | 1.1 $W/cm^2$ |
| Total gas flow | 30 sccm (Ar + $O_2$) |
| T/S | 50 mm |
| Substrate | Corning 7059 |
| Film thickness | 1300 ± 100 Å |
| Substrate temperature | 290° C. |

For the occurrence of blackening, the formation of black nodules on the surface of the target as the result of a running operation for 5 kW·hr was evaluated on a relative basis.

The formed ITO films were measured for light transmittance and specific resistance. As an optimal range for oxygen partial pressure, a bottom region was selected and that was where the light transmittance of the ITO film was at least 85% ($\lambda$=540 nm) to cause no turbidity and where the specific resistance was held at a desired low level. The results are shown in Table 1.

EXAMPLE 2

The same procedures as in Example 1 were repeated except that sintering was performed at 1550° C. for 5 hours in a sintering furnace the inside of which had been turned into a gaseous atmosphere containing 90 vol. % of $O_2$ by introducing a flow of oxygen gas to replace the air. The results are as shown in Table 1.

EXAMPLE 3

Sintering was performed in the same manner as in Example 2 except that the starting materials were prepared in such a manner that the $SnO_2$ content as one of the bulk characteristics would become 4 wt % and the sintering atmosphere was air instead of the gaseous mixture containing 90 vol. % of $O_2$. The resulting sinter was machined or fabricated into the target and films were formed by sputtering in the same manner as in Example 1. The results are as shown in Table 1.

EXAMPLE 4

Sintering was performed in the same manner as in Example 3 except that the staring materials were prepared so that the $SnO_2$ content thereof would become 15 wt %. The resulting sinter was fabricated in the same manner as in Example 1 and the film formation and the measurements were effected in the same manners as in Example 1. The results are as shown in Table 1.

Comparative Example 1

The same procedures as in Example 1 were repeated except that the sintering temperature was 1350° C. The results are as shown in Table 1.

Comparative Example 2

The same granulated particles as those in Example 1 were placed in a mold made of carbon and hot pressing was effected in Ar at 1200° C. for 3 hours. The pressure applied was 200 kg/cm$^2$. The resulting sinter was fabricated into the target and measurement was effected in the same manner as in Example 1. The results are as shown in Table 1.

As described on the foregoing pages, the ITO sputtering target of the invention expands an optimal range for the proportion of oxygen in a mixture of argon and oxygen gases as a sputtering atmosphere by a sufficient extent to enable consistent formation of high-quality ITO films.

TABLE 1

| Run No. | Ex. 1 | Ex. 2 | Ex. 3 | Ex. 4 | Comp. Ex. 1 | Comp. Ex. 2 |
|---|---|---|---|---|---|---|
| Sintering conditions | | | | | | |
| Temperature, ° C. | 1500 | 1550 | 1550 | 1550 | 1350 | 1200 |
| Holding time, hr | 5 | 5 | 5 | 5 | 5 | 3 |
| Atmosphere (O$_2$ content) | Air (21%) | oxygen flow (90%) | Air (21%) | Air (21%) | Air (21%) | Ar |
| Bulk characteristics | | | | | | |
| Density, g/cm$^3$ | 6.45 | 7.05 | 6.50 | 6.40 | 6.00 | 6.55 |
| Specific resistance, Ω · cm | $1.5 \times 10^{-4}$ | $1.1 \times 10^{-4}$ | $1.2 \times 10^{-4}$ | $3.5 \times 10^{-4}$ | $5.0 \times 10^{-4}$ | $3 \times 10^{-3}$ |
| oxygen content, wt % | 16.8 | 16.2 | 16.30 | 16.50 | 17.20 | 14.55 |
| SnO$_2$ content, wt % | 10 | 10 | 4 | 15 | 10 | 10 |
| Film formation | | | | | | |
| Blackening | ○ | ⊚ | ○ | ○ | X | Δ |
| Optimal O$_2$ range, vol % | 0.6–3.0 | 0.6–3.0 | 0.3–1.5 | 0.8–3.0 | 0.6–3.0 | 1.5–2.5 |
| Specific resistance of film, Ω · cm | $1.6 \times 10^{-4}$ | $1.4 \times 10^{-4}$ | $2.5 \times 10^{-4}$ | $2.3 \times 10^{-4}$ | $3.0 \times 10^{-4}$ | $2.7 \times 10^{-4}$ |

⊚: Excellent, ○: good, Δ: fair, X: poor
O$_2$ (vol %) = (Oxygen volume)/(Total volume of argon and oxygen) × 100
Specific resistance of film: Minimum specific resistance of the film formed in the atmosphere of optimal O$_2$ vol %

What is claimed is:

1. A sintered ITO having a relative density of at least 88%, an oxygen content of 15.5 to 17.0 wt % and a specific resistance of no more than 2×10$^{-4}$ Ω·cm.

2. The sintered ITO according to claim 1, wherein the specific resistance is 1.5×10$^{-4}$ Ω·cm.

3. The sintered ITO according to claim 1, wherein the specific resistance is 1.1×10$^{-4}$ Ω·cm.

4. The sintered ITO according to claim 1, wherein the specific resistance is 1.2×10$^{-4}$ Ω·cm.

5. A sintered ITO according to claim 1, which is prepared by a process comprising selecting a mixed SnO$_2$ and In$_2$O$_3$ powder containing 4–15 wt % SnO$_2$ and having a specific surface area as measured by the BET method of 20 m$^2$/g or more as a starting material, wet dispersing the mixed powder into a slurry containing solid particles whose average particle size is no larger than 1.0 μm, subjecting the slurry to the granulating treatment to obtain granulated particles, pressing the granulated particles into a compact having a relative density of 45% or more and sintering the compact at a temperature in the range of 1400–1600° C. in an atmosphere containing from 20% to less than 100% of oxygen.

6. A method of forming an ITO film which comprises sputtering with an ITO sputtering target comprising a backing plate having fixed thereon an ITO sinter according to claim 1, said ITO sinter having a relative density of at least 88% and an oxygen content of 15.5 to 17.0 wt %, wherein the sputtering is carried out in a mixed oxygen and argon gas atmosphere containing 0.6 to 3.0 vol. % oxygen.

7. An ITO sputtering target comprising an ITO sinter having a relative density of at least 88%, an oxygen content of 15.5 to 17.0 wt %, and a specific resistance of no more than 2×10$^{-4}$ Ω·cm.

8. An ITO sputtering target according to claim 7, which comprises an ITO sinter prepared by a process comprising selecting a mixed SnO$_2$ and In$_2$O$_3$ powder containing 4–15 wt % SnO$_2$ and having a specific surface area as measured by the BET method of 20 m$^2$/g or more as a starting material, wet dispersing the mixed powder into a slurry containing solid particles whose average particle size is no larger than 1.0 μm, subjecting the slurry to the granulating treatment to obtain granulated particles, pressing the granulated particles into a compact having a relative density of 45% or more and sintering the compact at a temperature in the range of 1400–1600° C. in an atmosphere containing from 20% to less than 100% of oxygen.

9. A sintered ITO having a relative density of at least 88%, and an oxygen content of 15.5 to 17.0 wt %, which contains tin in an amount of 4 to 15 wt % as tin oxide and has a specific resistance of no more than 2×10$^{-4}$ Ω·cm.

10. A sintered ITO according to claim 9, which is prepared by a process comprising selecting a mixed SnO$_2$ and In$_2$O$_3$ powder containing 4–15 wt % SnO$_2$ and having a specific surface area as measured by the BET method of 20 m$^2$/g or more as a starting material, wet dispersing the mixed powder into a slurry containing solid particles whose average particle size is no larger than 1.0 μm, subjecting the slurry to the granulating treatment to obtain granulated particles, pressing the granulated particles into a compact having a relative density of 45% or more and sintering the compact at a temperature in the range of 1400–1600° C. in an atmosphere containing from 20% to less than 100% of oxygen.

11. An ITO sputtering target comprising an ITO sinter having a relative density of at least 88% and an oxygen content of 15.5 to 17.0 wt %, said ITO sinter containing tin in an amount of 4 to 15 wt % as tin oxide, and having a specific resistance of no more than 2×10$^{-4}$ Ω·cm.

12. An ITO sputtering target according to claim 11, which comprises an ITO sinter prepared by a process comprising selecting a mixed SnO$_2$ and In$_2$O$_3$ powder containing 4–15 wt % $SnO_2$ and having a specific surface area as measured by the BET method of 20 $m^2/g$ or more as a starting material, wet dispersing the mixed powder into a slurry containing solid particles whose average particle size is no larger than 1.0 μm, subjecting the slurry to the granulating treatment to obtain granulated particles, pressing the granulated particles into a compact having a relative density of 45% or more and sintering the compact at a temperature in the range of 1400–1600° C. in an atmosphere containing from 20% to less than 100% of oxygen.

* * * * *